(12) United States Patent
Akiyama et al.

(10) Patent No.: US 12,102,012 B2
(45) Date of Patent: Sep. 24, 2024

(54) MAGNETORESISTANCE MEMORY DEVICE AND METHOD OF MANUFACTURING MAGNETORESISTANCE MEMORY DEVICE

(71) Applicant: Kioxia Corporation, Tokyo (JP)

(72) Inventors: Naoki Akiyama, Seoul (KR); Kenichi Yoshino, Seongnam-si (KR)

(73) Assignee: Kioxia Corporation, Tokyo (JP)

(*) Notice: Subject to any disclaimer, the term of this patent is extended or adjusted under 35 U.S.C. 154(b) by 380 days.

(21) Appl. No.: 17/472,395

(22) Filed: Sep. 10, 2021

(65) Prior Publication Data

US 2022/0293850 A1 Sep. 15, 2022

(30) Foreign Application Priority Data

Mar. 12, 2021 (JP) ................ 2021-040518

(51) Int. Cl.
*H10N 50/80* (2023.01)
*G11C 11/16* (2006.01)
*H10B 61/00* (2023.01)
*H10N 50/01* (2023.01)
*H10N 50/85* (2023.01)

(52) U.S. Cl.
CPC ........... *H10N 50/80* (2023.02); *G11C 11/161* (2013.01); *H10B 61/10* (2023.02); *H10N 50/01* (2023.02); *H10N 50/85* (2023.02)

(58) Field of Classification Search
CPC ........ H10N 50/80; H10N 50/01; H10N 50/85; H10N 50/10; G11C 11/161; G11C 11/1659; H10B 61/20
See application file for complete search history.

(56) References Cited

U.S. PATENT DOCUMENTS

| 8,912,013 | B2 | 12/2014 | Zhu et al. |
| 10,446,227 | B2* | 10/2019 | Ota ................... G11C 13/0028 |
| 11,037,984 | B1* | 6/2021 | Song ................... H10N 70/826 |
| 2014/0097477 | A1 | 4/2014 | Kanaya |

(Continued)

FOREIGN PATENT DOCUMENTS

| JP | 2014140068 A | 7/2014 |
| JP | 6151650 B2 | 6/2017 |

(Continued)

OTHER PUBLICATIONS

U.S. Appl. No. 17/199,593; First Named Inventor: Kenichi Yoshino; Title: "Magnetic Memory Device and Method for Manufacturing the Same"; filed Mar. 12, 2021.

(Continued)

*Primary Examiner* — Yara B Green
*Assistant Examiner* — Fakeha Sehar
(74) *Attorney, Agent, or Firm* — Holtz, Holtz & Volek PC

(57) ABSTRACT

According to one embodiment, a magnetoresistance memory device includes: a first conductor; a variable resistance material on a top surface of the first conductor; a second conductor on a top surface of the variable resistance material; a first insulator other than nitride on a top surface of the second conductor; a magnetoresistance effect element on a top surface of the first insulator; and a third conductor located on a side surface of the first insulator and extending on a side surface of the second conductor and a side surface of the magnetoresistance effect element.

13 Claims, 12 Drawing Sheets

(56) References Cited

U.S. PATENT DOCUMENTS

| | | | |
|---|---|---|---|
| 2016/0118442 A1* | 4/2016 | Kim | H10B 63/20 |
| | | | 711/147 |
| 2017/0098683 A1 | 4/2017 | Ohba et al. | |
| 2017/0352807 A1* | 12/2017 | Ha | H10N 70/883 |
| 2019/0074429 A1* | 3/2019 | Karpov | H10B 61/22 |
| 2020/0035916 A1 | 1/2020 | Trinh | |
| 2020/0294566 A1* | 9/2020 | Tsubata | H10N 50/85 |
| 2020/0335692 A1 | 10/2020 | Seong et al. | |
| 2020/0365795 A1 | 11/2020 | Chuang et al. | |
| 2021/0074908 A1 | 3/2021 | Oikawa et al. | |
| 2021/0074911 A1 | 3/2021 | Isoda et al. | |
| 2021/0083170 A1 | 3/2021 | Sawada et al. | |
| 2021/0287727 A1 | 9/2021 | Tsubata et al. | |
| 2021/0408114 A1* | 12/2021 | Lille | H10N 50/01 |
| 2022/0044718 A1* | 2/2022 | Guo | H10N 52/80 |

FOREIGN PATENT DOCUMENTS

| | | |
|---|---|---|
| JP | 2019114644 A | 7/2019 |
| TW | 202006924 A | 2/2020 |
| TW | 202042343 A | 11/2020 |

OTHER PUBLICATIONS

U.S. Appl. No. 17/349,203; First Named Inventor: Naoki Akiyama; Title: "Magnetoresistance Memory Device and Method of Manufacturing Magnetoresistance Memory Device"; filed Jun. 16, 2021.

U.S. Appl. No. 17/471,327; First Named Inventor: Takao Ochiai; Title: "Magnetoresistance Memory Device and Method of Manufacturing Magnetoresistance Memory Device"; filed Sep. 10, 2021.

U.S. Appl. No. 17/472,414; First Named Inventor: Kenichi Yoshino; Title: "Magnetic Memory Device and Manufacturing Method of Magnetic Memory Device"; filed Sep. 10, 2021.

* cited by examiner

MAGNETORESISTANCE MEMORY DEVICE AND METHOD OF MANUFACTURING MAGNETORESISTANCE MEMORY DEVICE

CROSS-REFERENCE TO RELATED APPLICATION

This application is based upon and claims the benefit of priority from prior Japanese Patent Application No. 2021-40518, filed Mar. 12, 2021, the entire contents of which are incorporated herein by reference.

FIELD

Embodiments described herein relate generally to a magnetoresistance memory device.

BACKGROUND

A magnetoresistance memory device is known as a sort of memory device. The magnetoresistance memory device stores data using a memory cell including an element exhibiting a magnetoresistance effect. To improve the characteristics of the magnetoresistance memory device, it is desirable to inhibit magnetic properties of a memory cell from being degraded.

BRIEF DESCRIPTION' OF TEE DRAWINGS

DETAILED DESCRIPTION

Figure 1:
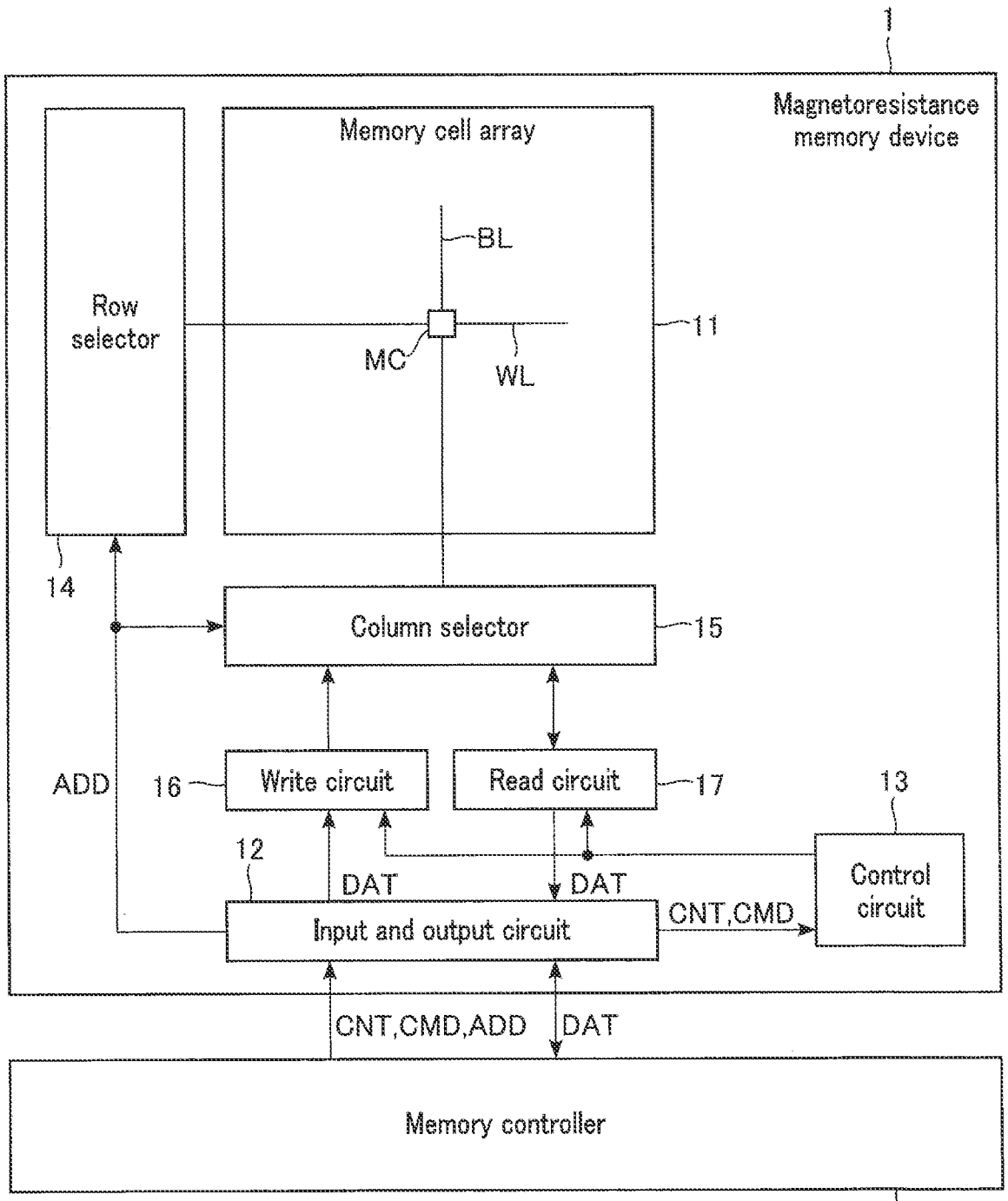
FIG. 1 shows a functional block of a magnetoresistance memory device according to a first embodiment and its associated components.

In general, according to one embodiment, a magnetoresistance memory device includes: a first conductor; a variable resistance material on a top surface of the first conductor; a second conductor on a top surface of the variable resistance material; a first insulator other than nitride on a top surface of the second conductor; a magnetoresistance effect element on a top surface of the first insulator; and a third conductor located on a side surface of the first insulator and extending on a side surface of the second conductor and a side surface of the magnetoresistance effect element.

Embodiments will now be described with reference to the figures. In the following description, components with substantially the same functionalities and configurations will be referred to with the same reference numerals, and repeated descriptions may be omitted.

The figUres are schematic, and the relation between the thickness and the area of a plane of a layer and the ratio of thicknesses of layers may differ from the actual ones.

The figures may include components which differ in relations and/or ratios of dimensions in different figures. In the specification and the claims, a phrase of a particular first component being "coupled" to another second component includes the first component being; coupled to the second component either directly or via one or more components which are always or selectively conductive.

The embodiments will be described using an xyz orthogonal coordinate system.

1.1. Structure (Configuration)

1.1.1. Overall Structure

FIG. 1 shows functional blocks of a memory device according to a first embodiment. As shown in FIG. 1, the magnetoresistance memory device 1 is controlled by a memory controller 2. The magnetoresistance memory device 1 includes a memory cell array 11, an input and output circuit 12, a control circuit 13, a row selector 14, a column selector 15, a write circuit 16, and a read circuit 17.

The memory cell array 11 includes memory cells MC, word lines WL, and bit lines BL. The memory cells MC can store data in a non-volatile manner. Each memory cell MC is coupled to a single word line WL and a single bit line BL. Each word line WL is associated with a row. Each bit line BL is associated with a column. Selection of a single row and selection of a single column specify a single memory cell MC.

The input and output circuit 12 receives a control signal CNT, a command CMD, an address signal ADD, and data (write data) DAT from a memory controller 2. The input and output circuit 12 transmits data (read data) DAT to the memory controller 2.

The row selector 14 receives the address signal ADD from the input and output circuit 12, and brings a single word line WL associated with the row specified by the received address signal ADD into a selected state.

The column selector 15 receives the address signal ADD from the input and output circuit 12 and brings bit lines BL associated with the column specified by the received address signal ADD into a selected state.

The control circuit 13 receives the control signal CNT and the command CND from the input and output circuit 12. The control circuit 13 controls the write circuit 16 and the read circuit 17 based on a control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages used for data writing to the column selector 15 based on the control by the control circuit 13 and the write data DAT.

The read circuit 17 uses the voltages used for data reading based on the control of the control circuit 13, to determine data stored in the memory cells MC. The determined data is supplied to the input and output circuit 12 as the read data DAT. The read circuit 17 includes a sense amplifier.

1.1.2, Circuit Configuration of Memory Cell Array

Figure 2:
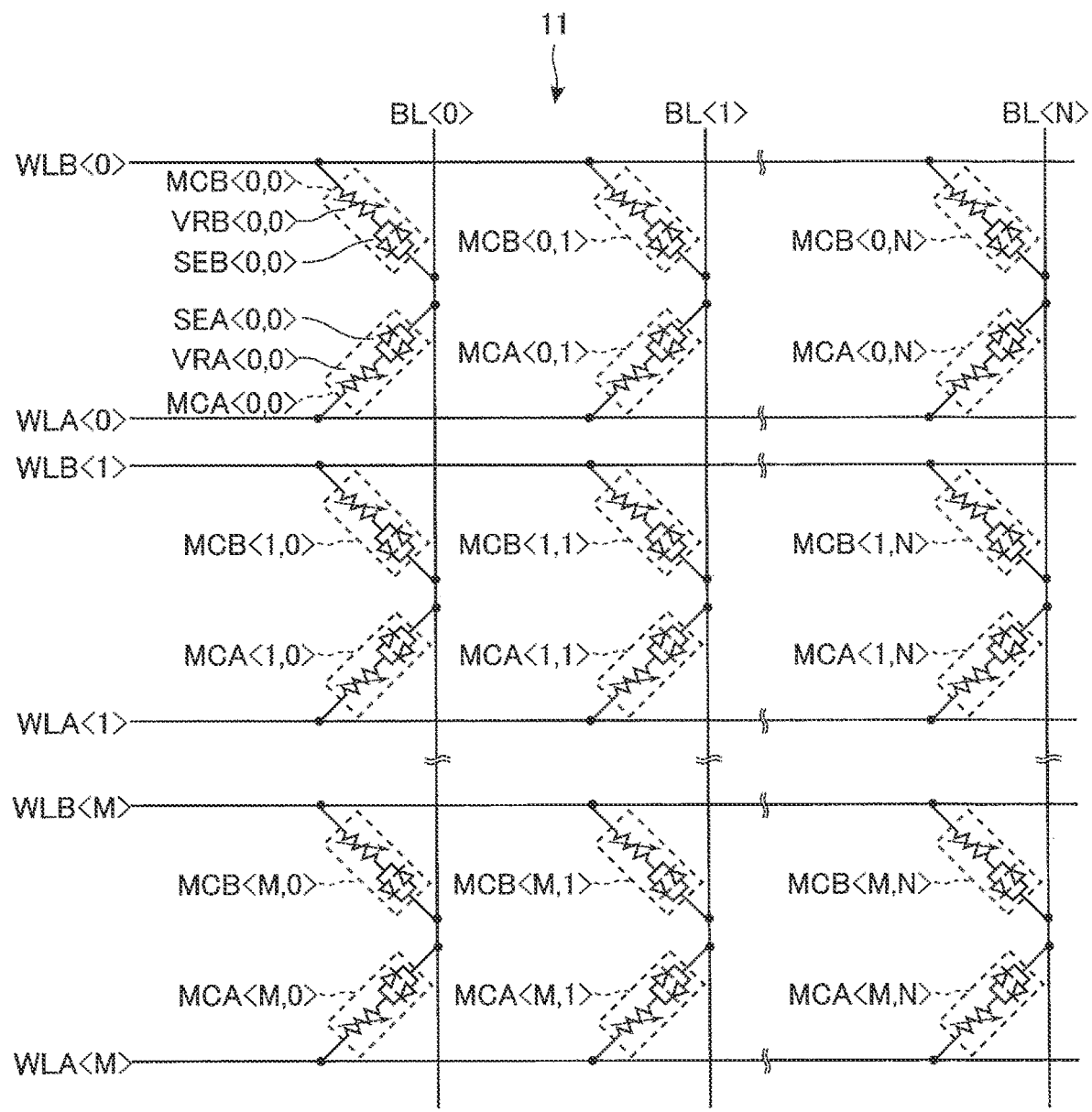
FIG. 2 is a circuit diagram of a memory cell array according to the first embodiment.

FIG. 2 is a circuit diagram of a memory cell array 11 according to the first embodiment. As shown in FIG. 2, the memory cell array 11 includes (M+1) word lines WLA (WLA<0>, WLA<1>, . . . , and WLA<M>) and (M+1) word lines WLB (WLB<0>, WLB<1>, . . . , and WLB<M>), where M is a natural number. The memory cell array 11 also includes (N+1) bit lines BL (BL<0>, BL<1>, . . . , and BL<N>), where N is a natural number.

Each of the memory cells MC (MCA and MCB) includes two nodes.

Each memory cell MC is coupled, at its first node, to a single word line WL, and is coupled, at its second node, to a single bit line BL. More specifically, the memory cells MCA encompass memory cells MCA<α,β> for all combinations of α and β, where a is every integer equal to or greater than 0 and equal to or less than M, and β is every integer equal to or greater than 0 and equal to or less than N, and the memory cell MCA<α,β> is coupled between the word line WLA<α> and the bit line BL<β>. Similarly, the memory cells MCB encompass memory cells MCB α,β>, for all combinations of α and β, where a is every integer equal to or greater than 0 and equal to or less than M, and β is every integer equal to or greater than 0 and equal to or less than N, and the memory cell MCB<α,β> is coupled between the word line WLB<α> and the bit line BL<β>.

Each memory cell MC includes a single magnetoresistance effect element. VP. (VRA or VRB) and a single selector SE (SEa or SEb). More specifically, the memory cell MCa<α,β> includes a magnetoresistance effect element VRA<α,β> and a selector SEa<α,β> for all combinations of α and β, where α is every integer equal to or greater than 0 and equal to or less than M, and β is every integer equal to or greater than 0 and equal to or less than N. Each memory cell MCb<α,β> includes a magnetoresistance effect element VRB<α,β> and a selector SEb<α,β> for all combinations of α and β, where a is every integer equal to or greater than 0 and equal to or less than M, and β is every integer equal to or greater than 0 and equal to or less than N.

In each memory cell MC, the magnetoresistance effect element VR and the selector SE are coupled in series. The magnetoresistance effect element VR is coupled to a single word line WL, and the selector SE is coupled to a single bit line BL.

The magnetoresistance effect element VR can switch between a low-resistance state and a high-resistance state. The magnetoresistance effect element VR can store 1-bit data, using the difference in the two resistance states.

The selector SE can be a switching element described below, for example. The switching element includes two terminals, and, when a voltage smaller than a first threshold is applied in a first direction between the two terminals, the switching element is in a high-resistance state, i.e., electrically non-conductive (in an OFF state). In contrast, when a voltage equal to or greater than a first threshold is applied in the first direction between the two terminals, the switching element is in a low-resistance state, i.e., electrically conductive (in an ON state). The switching element is further equipped with a function similar to that of switching between the high-resistance state and the low-resistance state based on the magnitude of the voltage applied in the first direction, with respect to a second direction opposite to the first direction. In other words, the switching element is a bidirectional switching element. By turning the switching element on or off, it is possible to perform control as to whether or not to supply a current to a magnetoresistance effect element VR coupled to the switching element, namely, whether or not to select the magnetoresistance effect element VR.

1.1.3. Structure of Memory Cell Array

Figure 3:
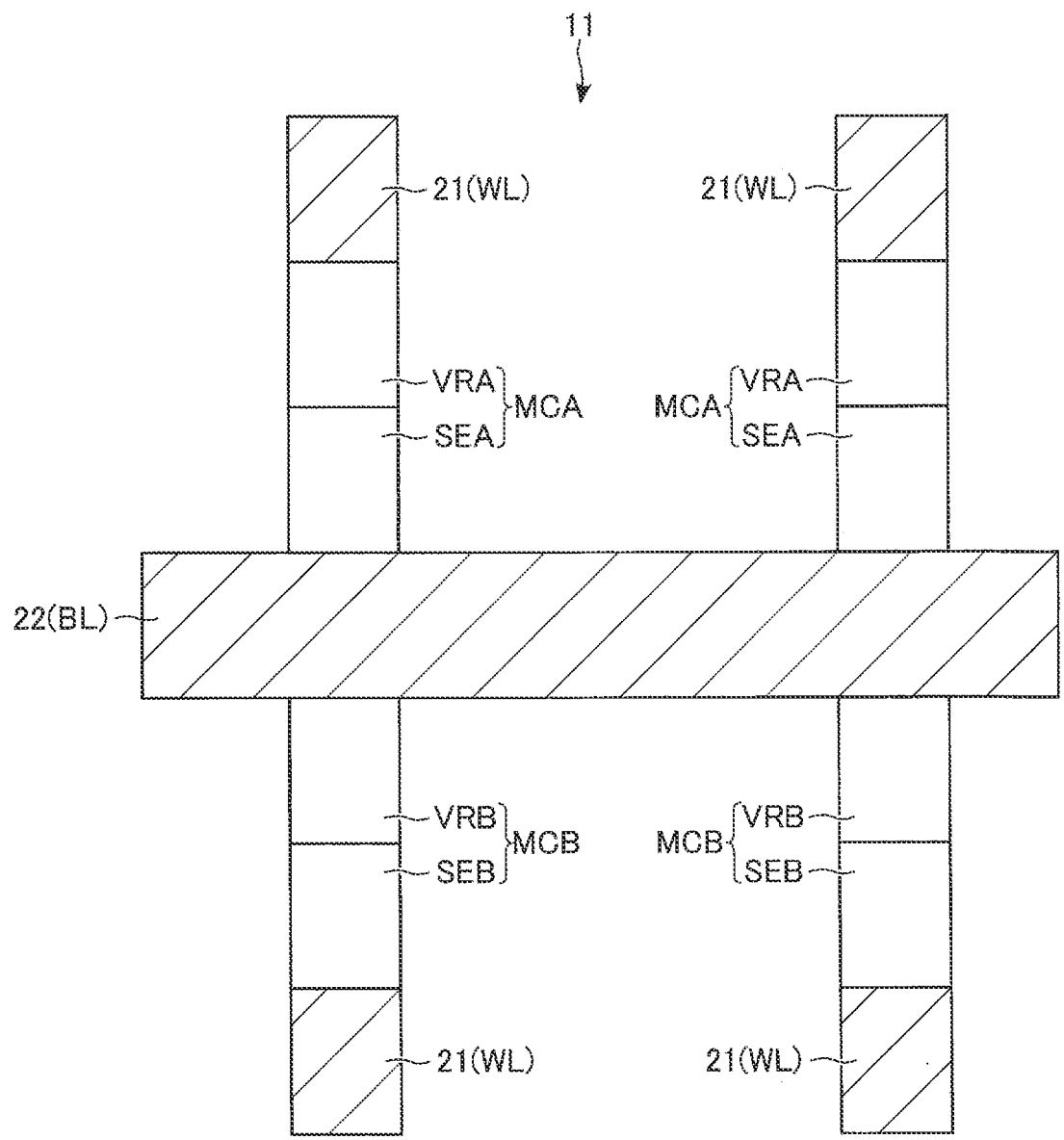
FIG. 3 shows a cross sectional structure of part of the memory cell array according to the first embodiment.
Figure 4:
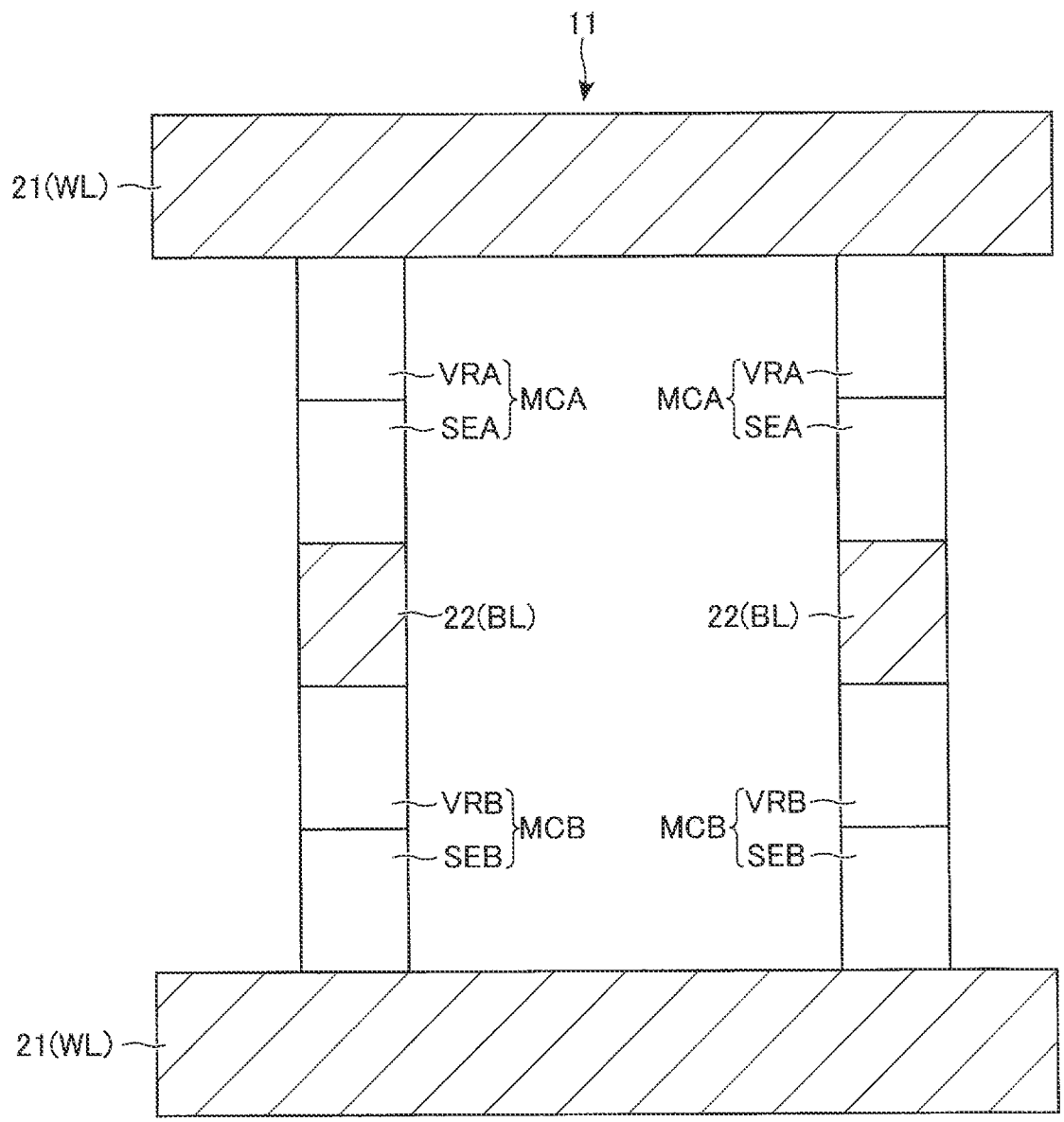
FIG. 4 shows a cross sectional structure of part of the memory cell array according to the first embodiment.

FIGS. 3 and 4 show a cross-sectional structure of part of the memory cell array 11 of the first embodiment. FIG. 3 shows the cross-section along the xz-plane, and FIG. 4 shows the cross-section along the yz-plane.

As shown in FIGS. 3 and 4, conductors 21 are provided above the semiconductor substrate (not shown), The conductors 21 extend along the v-axis and are aligned along the x-axis. Each conductor 21 functions as a word line WL.

Each conductor 21 is coupled, at its top surface, to the bottom surfaces of memory cells MOB. Each memory cell MOB has, for example, a circular shape in the xy-plane. The memory cells MOB are aligned along the y-axis on each conductor 21, and this arrangement provides a matrix of memory cells MCB over the xy-plane. Each memory cell MCB includes a structure that functions as a selector SEE and a structure that functions as a magnetoresistance effect element VRB. The structure that functions as a selector SEE and the structure that functions as a magnetoresistance effect element VRB each have one or more layers, as will be described later.

Conductors 22 are provided above the memory cells MCB. The conductors 22 extend along the x-axis and are aligned along the y-axis, Each conductor 22 is coupled, at its bottom surface, to the top surfaces of memory cells MCB aligned along the x-axis. Each conductor 22 functions as a bit line BL.

Each conductor 22 is coupled, at its top surface, to the bottom surfaces of memory cells MCA. Each memory cell MCA has, for example, a circular shape in the xy-plane. The memory cells MCA are aligned along the x-axis on each conductor 22, and this arrangement provides a matrix of memory cells MCA over the xy-plane. Each memory cell MCA includes a structure that functions as a selector SEA and a structure that functions as a magnetoresistance effect element VRA.

The structure that functions as a selector SEA and the structure that functions as a magnetoresistance effect element VRA each have one or more layers, as will be described later.

A further conductor 21 is provided on the top surfaces of memory cells MCA aligned along the y-axis.

1.1.4. Structure of Memory Cell

Figure 5:
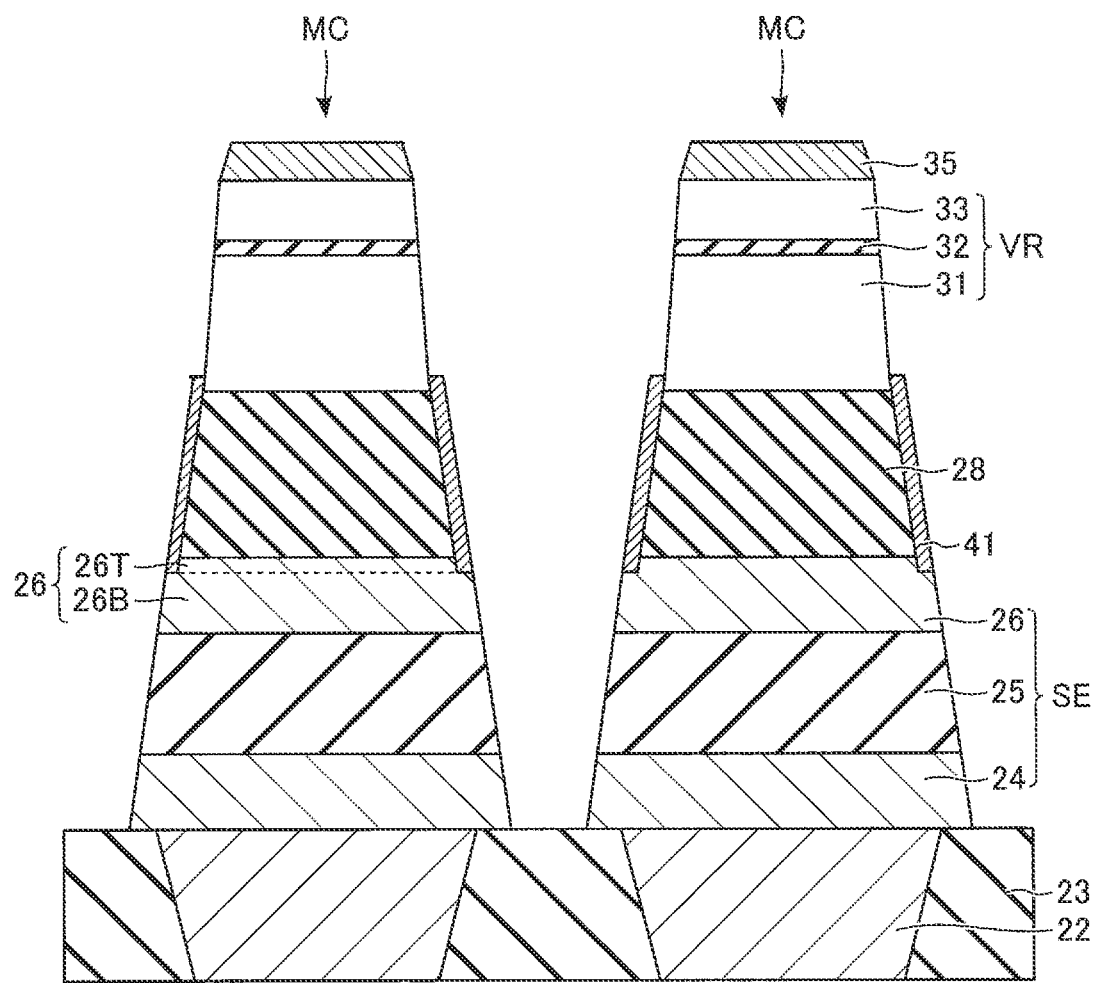
FIG. 5 shows a cross section of an example of the structure of a memory cell according to the first embodiment.

FIG. 5 shows a cross section of an example of the structure of a memory cell according to the first embodiment. FIG. 5 shows a structure from a layer at which a conductor 22 is located to the layer at which the first one of the conductors 21 from the conductor 22 along the z-axis is located. That is, the memory cell MC shown in FIG. 5 corresponds to memory cell MCA.

As shown in FIG. 5, an interlayer insulator 23 is formed above a semiconductor substrate (not shown). A conductor 22 is formed within the interlayer insulator 23. On the top surface of each conductor 22, a memory cell MC is located.

Each memory cell MC includes a selector SE, an insulator 28, a magnetoresistance effect element VR, hardmask 35, and a conductor 41. The memory cell MC may include additional layers.

Each selector SE is located on the top surface of a single conductor 22 and its side surface is tapered. Each selector SE may have the shape of a truncated cone, for example. When the selector SE has the shape of a truncated cone, the structure thereof in the cross section differing from the cross section shown in FIG. 5 is the same as the structure shown in FIG. 5 and described hereinafter with reference to FIG. 5.

The selector SE includes a lower electrode 24, a variable resistance material (layer) 25, and an upper electrode 26.

The lower electrode 24 is located on the Lop surface of the conductor 22 and either includes or is substantially made of titanium nitride (TiN). In the specification and the claims, expressions Such as "substantially" and "substantially made of" is intended to mean that an element "substantially made of" something may contain unintended impurities. When a voltage applied between the two terminals is less than a threshold, the switching element is in a "high-resistance" state, e.g., in an electrically non-conductive state. When a voltage applied between the two terminals is equal to or greater than the threshold, the switching element is in a. "low-resistance" state, e.g., in an electrically conductive state. The variable resistance material 25 is made of a material constituted by an insulator and contains a dopant introduced by ion injection. The insulator includes, for example, an oxide, and includes $SiO_2$ or a material substantially made of $SiO_2$. The dopant contains, for example, arsenic (As) and germanium (Ge).

The upper electrode 26 is located on the top surface of the variable resistance material 25 and includes or is substantially formed of, for example, one or more of titanium nitride (TiN), aluminum (Al), tantalum (Ta), tungsten (W), copper (Cu) and carbon (C). The upper electrode 26 has a lower portion 26B including the lower end of the upper electrode 26 and an upper portion 26T including the upper end of the upper electrode 26. The upper electrode 26 is stepped in its side surface at the boundary between the lower portion 26B and the upper portion 26T. That is, the side surface of the upper portion 26T is not on the extension line of the side surface of the lower portion 26B. In other words, the area of the upper end of the lower portion 26B, that is, the area of the boundary between the upper end of the lower portion 26B and the upper portion 26T, is larger than the area of the lower end of the upper portion. 26T, that is, the area of the boundary between the lower end of the upper portion 26T and the lower portion 26B.

The insulator 28 is located on the top surface of each upper electrode 26. The insulator 28 includes or is substantially formed of a material other than nitride. The insulator 28 is tapered on its side surface. The insulator 28 may have, for example, a truncated cone shape. When the insulator 28 has a truncated cone shape, the structure of the insulator in the cross section differing from the cross section shown in FIG. 5 is the same as the structure shown in FIG. 5 and described hereinafter with reference to FIG. 5.

The insulator 28 is intended to increase the spacing between the upper electrode 26 and the insulating layer 32 above the insulator 28. That is, the insulating layer 32 is required to be sufficiently separated from the upper electrode 26 for the reason described below. To achieve the intention, the thickness (a dimension along the z-axis) of the insulator 28 is determined. Between the upper electrode 26 and the insulating layer 32, a ferromagnetic layer 31 is located in addition to the insulator 28, as will be described later. The insulator 28 therefore has a thickness that corresponds to a difference between a desired spacing between the upper electrode 26 and the ferromagnetic layer 31 and the thickness of the ferromagnetic layer 31.

A single magnetoresistance effect element VR is located on the top surface of each insulator 28. The magnetoresistance effect element VR is tapered on its side surface. The magnetoresistance effect element VR may have, for example, the shape of a truncated cone. When the magnetoresistance effect element VR has the shape of a truncated cone, the structure of the magnetoresistance effect element. VR in a cross section differing from that shown in FIG. 5 is the same as the structure shown in FIG. 5 and described hereinafter with reference to FIG. 5. For example, the side surface of the magnetoresistance effect element VR is continuous to the side surface of the insulator 28.

The variable resistance element VR exhibits a tunnel magnetoresistance effect, and is, for example, an element that includes a magnetic tunnel junction (MTJ), or, MTJ element. The description below and the drawings are based on an example in which the variable resistance element VR is an MTJ element.

Specifically, the magnetoresistance effect element VR includes a ferromagnetic layer 31, an insulating layer 32, and a ferromagnetic layer 33. As an example, as shown in FIG. 5, the insulating layer 32 is on the top surface of the ferromagnetic layer 31, and the ferromagnetic layer 33 is on the top surface of the insulating layer 32.

The ferromagnetic layer 31 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The direction of magnetization of ferromagnetic layer 31 is intended to remain unchanged even when data is read or written in the magnetoresistance memory device 1. The ferromagnetic layer 31 can function as a so-called reference layer.

The ferromagnetic layer 31 may include a plurality of layers.

The insulating layer 32 includes or is substantially made of, for example, magnesium oxide (MgO), and functions as a so-called "tunnel barrier."

The ferromagnetic layer 33 includes or is substantially made of, for example, cobalt iron boron (CoFeB) or boride iron (FeB). The ferromagnetic layer 33 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The magnetization direction of ferromagnetic layer 33 can be changed by data writing, and the ferromagnetic layer 33 can function as a so-called "storage layer."

When the magnetization direction of ferromagnetic layer 33 is parallel to the magnetization direction of ferromagnetic layer 31, magnetoresistance effect element VR is in a state of a low resistance. When the magnetization direction of ferromagnetic layer 33 is anti-parallel to the magnetization direction of ferromagnetic layer 31, the magnetoresistance effect element VR is in a state of having a resistance higher than that in the case where the magnetization directions of the ferromagnetic layers 31 and 33 are anti-parallel.

When a certain magnitude of write current flows from the ferromagnetic layer 33 to the ferromagnetic layer 31, the magnetization direction of ferromagnetic layer 33 becomes parallel to the magnetization direction of ferromagnetic layer 31. In contrast, when another magnitude or write current flows from the ferromagnetic layer 31 to the ferromagnetic layer 33, the magnetization direction of ferromagnetic layer 33 becomes anti-parallel to the magnetization direction of ferromagnetic layer 31.

The hardmask 35 is located on the top surface of the magnetoresistance effect element VR, for example the top surface of the ferromagnetic layer 33. The hardmask 35 is made of a conductor, and includes, or is substantially constituted by, TiN, for example.

The conductor 41 includes or is substantially formed of the same material as that of the upper electrode 26. The conductor 41 includes a material that is removed from a portion of the upper electrode 26, as will be described below. The conductor 41 covers the entire side surface of the insulator 28.

The conductor 41 is in partial contact with the side surface of the upper electrode 26 in the lower portion including the lower end of the conductor 41, and covers, for example, part of the side surface of the upper electrode 26. That is, the conductor 41 is in contact with the side surface of the upper portion 26T of the upper electrode 26, and covers, for example, the side surface of the upper portion 26T of the upper electrode 26. The conductor 41 is also in contact with the top surface of the lower portion 26B of the upper electrode 26 at its lower portion. For example, the side surface of the conductor 41 is continuous, at the lower portion of the conductor 41, with the side surface of the selector SE, especially with the side surface of the upper electrode 26.

The conductor 41 may cover the entire side surface of the upper electrode 26 at the lower portion. However, the conductor 41 must not be in contact with the variable resistance material 25. In order to prevent the conductor 41 from being brought into unintentional contact with the variable resistance material 25 in the manufacturing process of the magnetoresistance memory device 1, the lower end of the conductor 41 should be sufficiently separated from the upper end of the variable resistance material 25. For example, the lower end of the conductor 41 can be separated from the upper end of the variable resistance material 25 by a distance exceeding the half of the thickness of the upper electrode 26. That is, the lower end of the conductor 41 is located along the z-axis higher than the middle of the upper electrode 26 in the z-direction.

The conductor 41 provides a current path for the upper electrode 26 which goes around by the insulator 28. In order to suppress resistance to the current flowing into and out of the upper electrode 26, the area of contact between the conductor 41 and the upper electrode 26 can be increased. The closer to the lower end of the upper electrode 26 the lower end of the conductor 41, the larger the contact area. The location of the lower end of the conductor 41 can thus be determined based on the balance of two factors of securing the contact area and securing the distance between the conductor 41 and the variable resistance material 25.

The conductor 41 is also in partial contact with the side surface of the ferromagnetic layer 31 in the upper portion including the upper end of the conductor 41, and covers, for example, part of the side surface of the ferromagnetic layer 31. That is, the conductor 41 is, at its upper portion which includes the upper end of the conductor 41, in contact with a portion of the side surface of the ferromagnetic layer 31 which includes the lower end of the ferromagnetic layer 31, and covers, for example, a portion of the side surface of the ferromagnetic layer 31 which includes the lower end of the ferromagnetic layer 31.

The conductor 41 provides a current path for the ferromagnetic layer 31 which goes around by the insulator 28. In order to suppress resistance to a current flowing into and out of the ferromagnetic layer 31, the area of contact between the conductor 41 and the ferromagnetic layer 31 can be increased. The closer to the upper end of the ferromagnetic layer 31 the upper end of the conductor 41, the larger the contact area.

When the material of the conductor 41 is in contact with the ferromagnetic layer in the magnetoresistance effect element VR, the material of the conductor 41 may degrade the magnetic properties of the ferromagnetic layer to which the material of the conductor 41 is attached. As described above, the conductor 41 includes the same material as that of the upper electrode 26. If, therefore, the material of the upper electrode 26 is in contact with the ferromagnetic layer in the magnetoresistance effect element VR, the material of the upper electrode 26 may degrade the magnetic properties of the ferromagnetic layer to which the material of the upper electrode 26. For this reason, it may be desirable to inhibit the conductor 41 from adhering to the side surface of the ferromagnetic layer 31. The position of the upper end of the conductor 41 can thus be determined based on the balance between two factors of the level of resistance of an interface between the conductor 41 and the ferromagnetic layer 31 and the degree of deterioration in magnetic properties of the ferromagnetic layer 31 due to the material of the conductor 41.

The conductor 41 extends onto the upper electrode 26 and the ferromagnetic layer 31 so that the conductor 41 can function as a current path between the upper electrode 26 and the ferromagnetic layer 31.

In the structure of the magnetoresistance memory device 1 shown in FIG. 5, a region including no components can be provided with an interlayer insulator. An insulator covering the surface of the memory cell MC can also be provided.

1.2. Manufacturing Method

Figure 6:
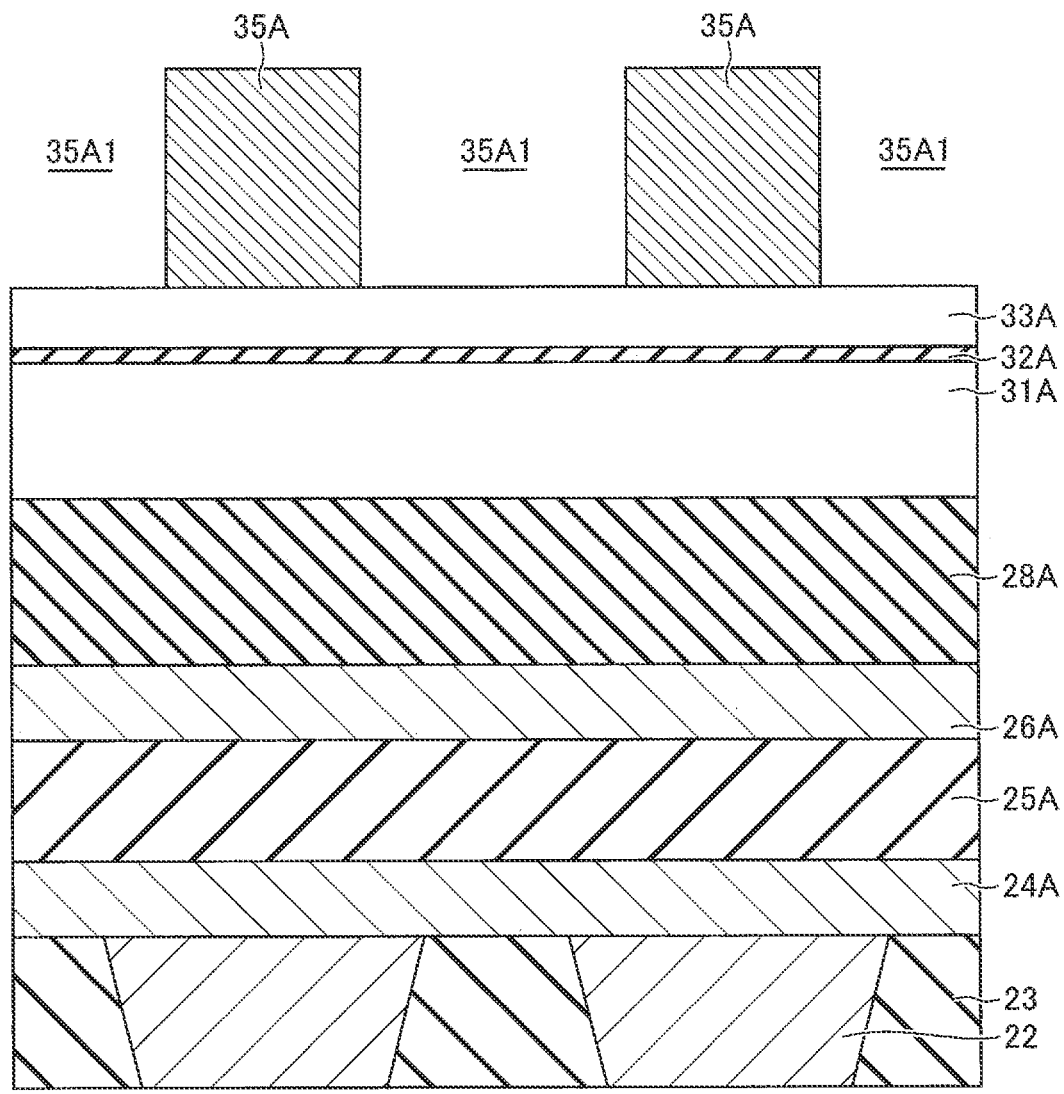
FIG. 6 shows a state in the manufacturing process of the structure of the memory cell according to the first embodiment.
Figure 7:
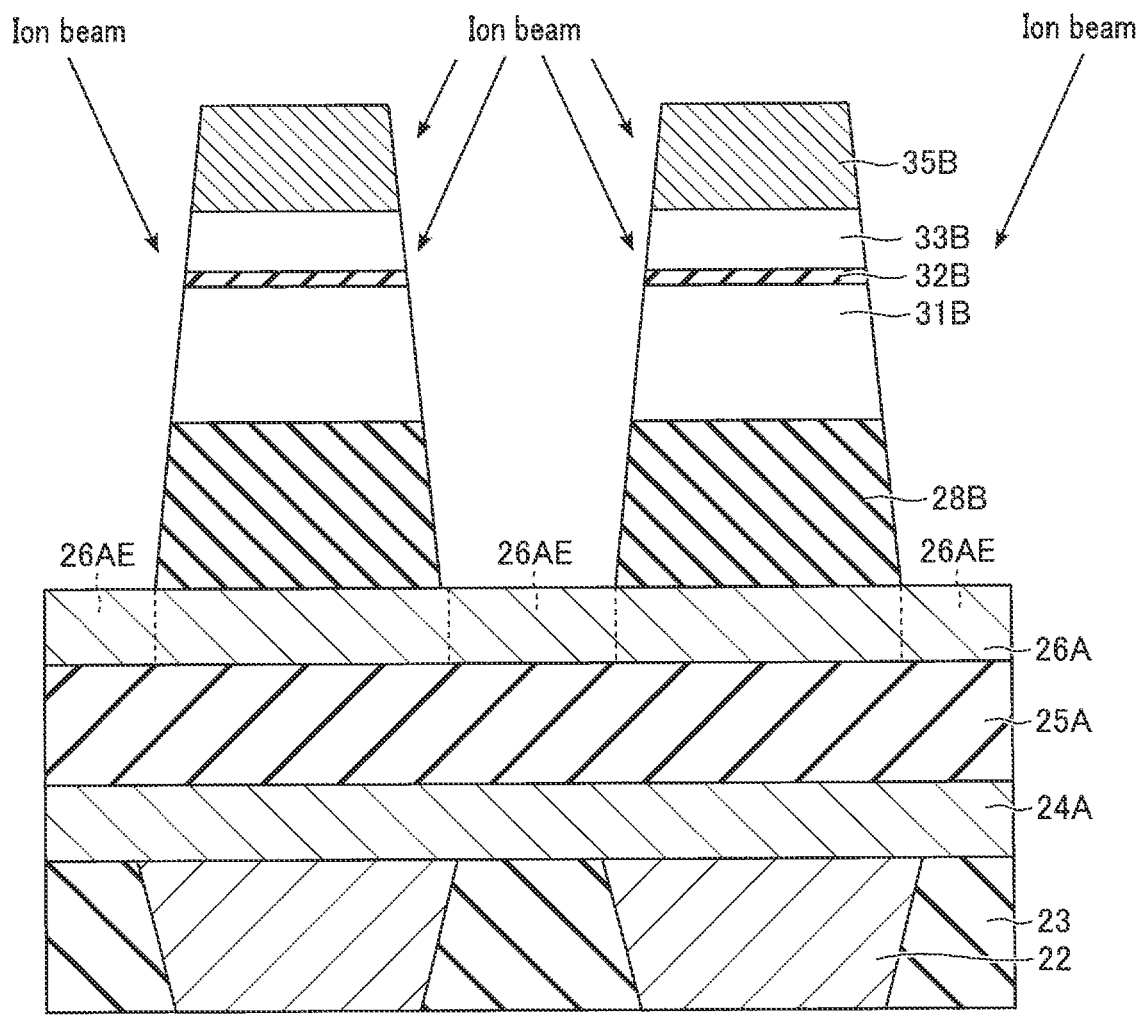
FIG. 7 shows a state subsequent to that shown in FIG. 6.
Figure 8:
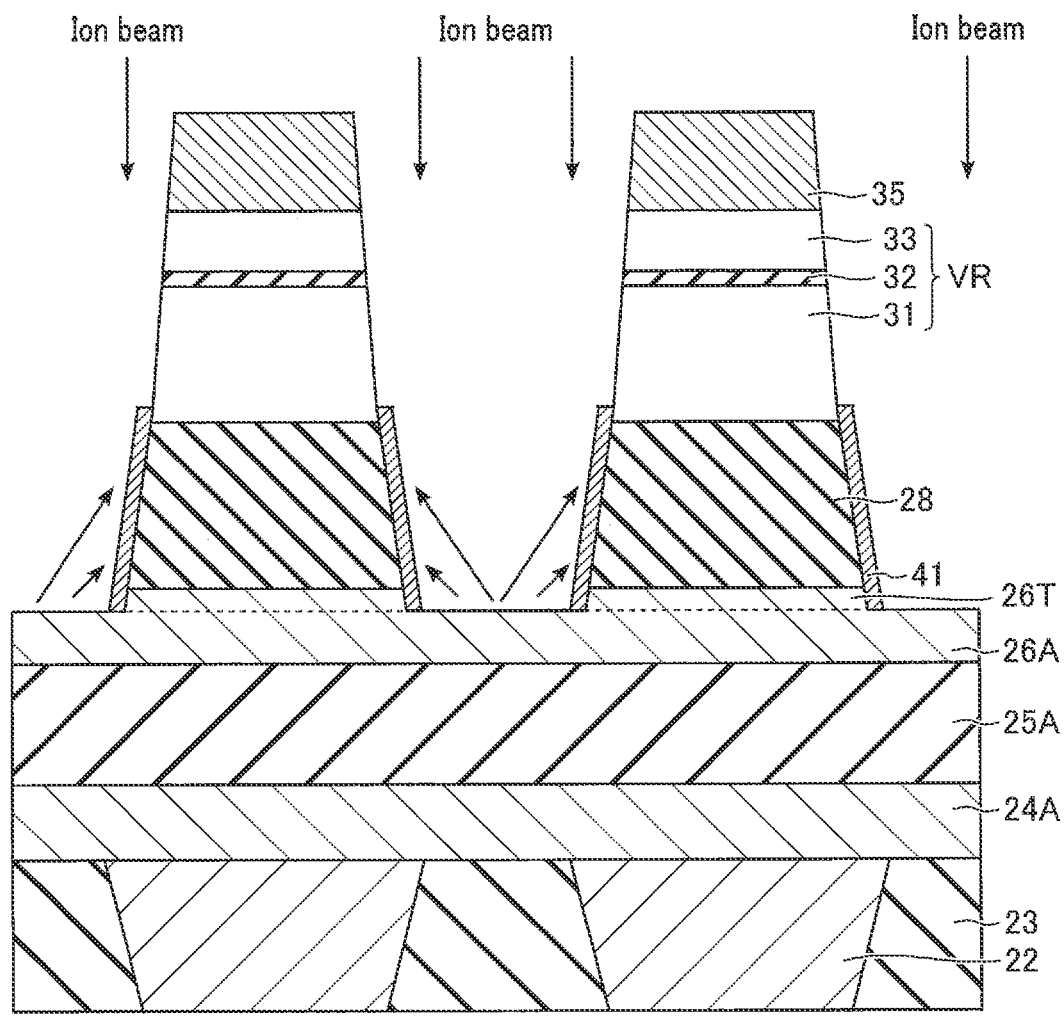
FIG. 8 shows a state subsequent to that shown in FIG. 7.

FIGS. 6 to 8 sequentially show states in a manufacturing process of part of the magnetoresistance memory device according to the first embodiment. FIGS. 6 to 8 shows cross sections of the same area as that shown in FIG. 5.

As shown in FIG. 6, a plurality of conductors 22, an interlayer insulator 23, a lower electrode 24A, a variable resistance material 25A, an upper electrode 26A, an insulator 28A, a ferromagnetic layer 31A, an insulating layer 32A, a ferromagnetic layer 33A and a hardmask 35A are formed. More specifically, the conductors 22 are formed in the interlayer insulator 23. Then, on the top surface of the interlayer insulator 23 and the top surfaces of the conductors 22, the lower electrode 24A, variable resistance material 25A, upper electrode 26A, insulator 28A, ferromagnetic layer 31A, insulating layer 32A, ferromagnetic layer 33A and hardmask 35A are deposited in that order presented. An example of a method of the deposition includes chemical vapor deposition (CD) and sputtering. The lower electrode 24A, variable resistance material 25A, upper electrode 26A, insulator 28A, ferromagnetic layer 31A, insulating layer 32A and ferromagnetic layer 33A are components which are formed into the lower electrode 24, variable resistance material 25, upper electrode 26, insulator 28, ferromagnetic layer 31, insulating layer 32 and ferromagnetic layer 33, respectively in a later step. The hardmask 35A remains immediately above a region where a magnetoresistance effect element VR is to be formed, and has an opening 35A1 in the remaining region. The opening 35A1 is formed to extend from the top surface of the hardmask 35A onto the bottom surface thereof.

As shown in FIG. 7, a plurality of sets of insulator 28B, ferromagnetic layer 31B, insulating layer 32B and ferromagnetic layer 33B are formed. More specifically the structure resulting through the foregoing steps is partly removed by ion beam etching (IBE). The IBE performed in the step of FIG. 7 may be referred to as first IBE.

The ion beams of the first IBE each have an angle with respect to the z-axis. These ion beams enter the opening 35A1 of the hardmask 35A to partly remove components exposed in the opening 35A1. Some ion beams are blocked by the hardmask 35A, i.e., due to shadowing effects of the hardmask 35A and do not reach a deep area in the opening 35A1. However, the hardmask 35A itself is also partly removed by the first TEE, and the top surface of the hardmask 35A gradually lowers as the first IBE progresses. As a result, as the first IBE progresses, the ion beams reach a deeper area in the opening 35A1. The first IBE is performed while rotating a structure targeted for the first IBE about the z-axis. Accordingly, as the first IBE progresses, the edges of a component subjected to etching on its xy-plane come closer to the center of the element equally. The first IBE is continued until at least the insulator 28A, ferromagnetic layer 31A, insulating layer 32A and ferromagnetic layer 33A are partly removed to expose the top surface of the upper electrode 26A.

With the first TEE, the insulator 28A, ferromagnetic layer 31A, insulating layer 32A and ferromagnetic layer 33A are partly removed to be formed into the insulator 28E, ferromagnetic layer 31B, insulating layer 32E and ferromagnetic layer 33B, respectively. Also, with the first IBE, the hardmask 35A is formed into the hardmask 35B.

A portion of the upper electrode 26A, which is exposed between the insulators 26B, is referred to as a portion 26AE of the upper electrode 26A.

As shown in FIG. 8, a conductor 41 is formed. More specifically, the structure resulting through the foregoing steps is partly removed by IBE. The IBE performed in the step of FIG. 8 may be referred to as second IBE. The second IBE is performed under conditions different from those used for performing the first IBE. The conditions that are different include at least an angle of ion beams. The angle of ion beams used in the second. TEE with respect to the z-axis is smaller than the angle of ion beams used in the first IBE with respect to the z-axis, and is, for example, close to 0°.

With the second IBE, the portion 26AE of the upper electrode 26A is partly removed to lower the top surface of the portion 26AE. As a result, a portion of the upper electrode 26A excluding the portion 26AE remains and accordingly an upper portion 26T is formed.

In the second IBE, the materials removed from materials targeted for etching are scattered. For example, when the portion 26AE of the upper electrode 26A is partly removed by the second IBE, the elements of the material of the upper electrode 26A are scattered. The scattered elements may be redeposited on components surrounding the origin of the scattering. The redeposition may occur on the side surface of the insulator 28, which is closest to the origin of the scattering. The conductor 41 is formed by the redeposition. The conductor 41 mainly contains the same materials as that of the upper electrode 26A due to how the conductor 41 is formed. The conductor 41 may contain not only the materials of the upper electrode 26 as a principal component, but also another material resulting from the performance of the second IBE. Therefore, the conductor 41 may not be formed of a material which is identical with that of the upper electrode 26A.

As described with reference to FIG. 5, the conductor 41 extends onto the upper electrode 26 and the ferromagnetic layer 31. The second IBE is thus performed under the conditions that allow redeposition to occur so that the conductor 41 is formed to extend onto the upper electrode 26 and the ferromagnetic layer 31. The conditions include one or more of the velocity of ion beams (or, energy of irradiation of ion beams), the angle of ion beams, and the element (i.e., mass) of ions. The conditions for forming the conductor 41 reaching the side surface of the ferromagnetic layer 31 depend at least in part on the thickness of the insulator 28 (insulator 28B). The thickness of the insulator 28 is therefore taken into consideration in determining the conditions.

With the second IBE, the insulator 28B, ferromagnetic layer 31B, insulating layer 32B and ferromagnetic layer 33A are somewhat partly removed to be formed into the insulator 28, ferromagnetic layer 31, insulating layer 32 and ferromagnetic layer 33, respectively. Also, with the second IBE, the hardmask 35B is formed into the hardmask 35.

Then, the upper electrode 26, the variable resistance material 25 and the lower electrode 24 are formed, as shown in FIG. 5. That is, the upper electrode 26A, variable resistance material 25A and lower electrode 24A are partly removed to be formed into the upper electrode 26, variable resistance material 25 and lower electrode 24, respectively. The upper electrode 26A, variable resistance material 25A and lower electrode 24A can be partly removed by any method. For example, the upper electrode 26, variable resistance material 25 and lower electrode 24 can be formed by continuing the IBE of the step shown in FIG. 8. Alternatively, the upper electrode 26, variable resistance material 25 and lower electrode 24 can be formed by reactive ion etching (RIE).

1.3 Advantages (advantageous effects)

The first embodiment can provide a memory cell having high characteristics as will be described below.

As a reference structure of the memory cell, a magnetoresistance effect element VR can be provided on the top surface of a selector SE having the same structure as that of the selector of the first embodiment. This structure can be achieved by IBE as in the first embodiment. Like in FIG. 6 of the first embodiment, the lower electrode 24A, variable resistance material 25A, upper electrode 26A, ferromagnetic layer 31A, insulating layer 32A and ferromagnetic layer 33A stacked one on another in that order presented are formed by IBE. Unlike in the first embodiment, the insulator 28A is not provided, with the result that the upper electrode 26A and the ferromagnetic layer 31A are close to each other and are separated only by a very short distance. Based on this, the following two phenomena may occur as a result of IBE for the upper electrode 26A.

Firstly, a large number of materials scattered from the upper electrode 26A by TEE can be deposited on the side surface of the ferromagnetic layer 31A. When the materials included in the upper electrode 26A, especially TiN is redeposited, it contains a lot of nitrogen. It is considered that when nitrogen adheres to a ferromagnetic layer, it degrades the magnetic properties of the ferromagnetic layer. If, therefore, a large number of materials of the upper electrode 26A are deposited on the side surface of the ferromagnetic layer 31A, the magnetic properties of the ferromagnetic layer 31A may be degraded and so may be the characteristics of the magnetoresistance effect element VR.

Secondly, the materials scattered from the upper electrode 26A by IBE makes it impossible that the magnetoresistance effect element VR exhibits a magnetoresistance effect. That is, since the upper electrode 26A and the ferromagnetic layer 31A are very close to each other, the materials scattered from the upper electrode 26A can be deposited on the side surface of the insulating layer 32 by IBE. The materials deposited on the side surface of the insulating layer 32 makes the ferromagnetic layers 31 and 33 electrically conductive. When the ferromagnetic layers 31 and 33 are electrically conducted to each other, the magnetoresistance effect element VR including these ferromagnetic layers 31 and 33 cannot exhibit a magnetoresistance effect. This magnetoresistance effect element VR cannot function as a memory cell.

According to the first embodiment, the insulator 28 is provided between the upper electrode 26 and the ferromagnetic layer 31. Thus, the upper electrode 26 and the ferromagnetic layer 31 are not in contact with each other but have a distance therebetween. During the formation of the upper electrode 26A by IBE, therefore, the materials scattered from the upper electrode 26A by IBE are difficult to deposit on the side surface of the ferromagnetic layer 31. The amount of deposition is at least smaller than that in the case where the insulator 28 is not included as in the reference structure. The first embodiment can thus provide a memory cell MC in which the deterioration of magnetic properties of the ferromagnetic layer 31 is suppressed more than that in the reference structure.

For the same reason, deposition of materials scattered from the upper electrode 26 by IBE on the side surface of the insulating layer 32 located farther from the upper electrode 26 than the ferromagnetic layer 31 is greatly suppressed or prevented. The first embodiment can thus provide a memory cell MC capable of exhibiting a magnetoresistance effect.

Since, unlike in the reference structure, the upper electrode 26 and the ferromagnetic layer 31 are not in contact with each other, they do not have a current path formed through an interface between them. According to the first embodiment, however, the conductor 41 is provided to extend on the side surface of the upper electrode 26 and the side surface of the ferromagnetic layer 31 to form a current path between the upper electrode 26 and the ferromagnetic layer 31. Thus, the selector SE and the magnetoresistance effect element VR can be electrically coupled to each other. When the materials scattered from a component exposed to IBE adhere to its surrounding components, such redeposition of the materials may cause unintended results. It is thus generally desirable to suppress the redeposition. In the first embodiment, the redeposition is actively used to address formation of no electrical coupling at the interface between the upper electrode 26 and the ferromagnetic layer 31 due to the insulator 28 inserted between the upper electrode 26 and the ferromagnetic layer 31. Using the redeposition actively, the conductor 41 is formed on the side surface of the insulator 28 to provide electrical coup ling between the upper electrode 26 and the ferromagnetic layer 31.

According to the first embodiment, the insulator 28 includes or is substantially formed of a material other than nitride. Thus, the insulator 28, which is inserted between the upper electrode 26 and the ferromagnetic layer 31 to secure a distance therebetween, inhibits nitrogen from adhering to the ferromagnetic layer 31. Accordingly, the insulator 28 inhibits the magnetic properties of the ferromagnetic layer 31 from being degraded.

2. Second Embodiment

The second embodiment differs from the first embodiment in the structure for electrical coupling between the upper electrode 26 and the ferromagnetic layer 31. The features of the second embodiment which differ from those of the first embodiment will be mainly described.

The magnetoresistance memory device 1, memory cell MC, selector SE, upper electrode 26 and insulator 28 of the second embodiment are respectively different from the magnetoresistance memory device 1, memory cell MC, selector SE, upper electrode 26 and insulator 28 of the first embodiment. The magnetoresistance memory device 1, memory cell MC, selector SE, upper electrode 26 and insulator 28 of the second embodiment may be referred to as a magnetoresistance memory device 1b, a memory cell MCb, a selector SEb, an upper electrode 26b and an insulator 28b, respectively in order to distinguish them from the magnetoresistance memory device 1, memory cell MC, selector SE, upper electrode 26 and insulator 28 of the first embodiment.

2.1. Structure

Figure 9:
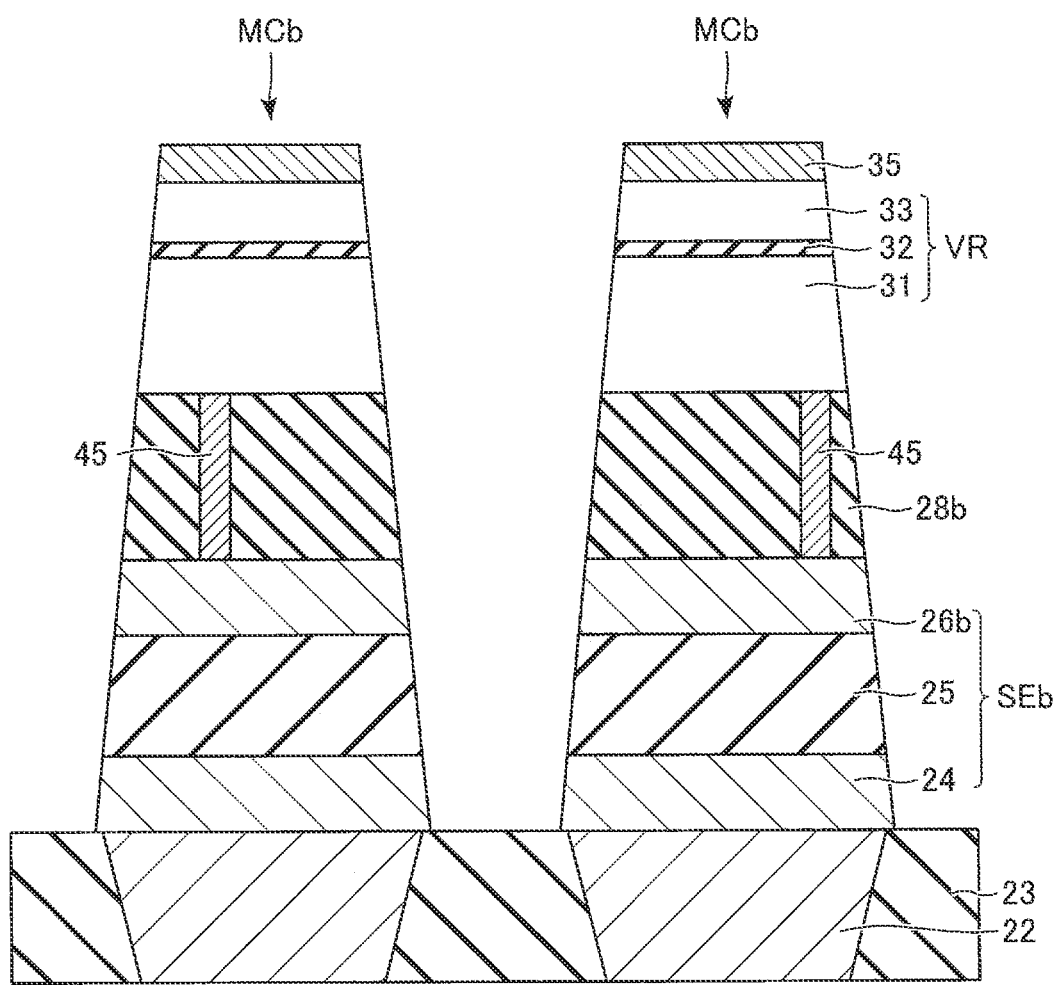
FIG. 9 shows a cross section of an example of the structure of a memory cell, according to a second embodiment.

FIG. 9 shows a cross section of an example of the structure of a memory cell according to the second embodiment. In FIG. 9, the memory cell MCb corresponds to a memory cell MCA, as in FIG. 5 of the first embodiment.

The selector SEb includes an upper electrode 26b instead of the upper electrode of the first embodiment. The upper electrode 26b has a side surface continuing from its bottom surface to its top surface, and does not include a stepped portion like the upper electrode 26. The side surfaces of the selector SEb, insulator 28b and magnetoresistive element VR are continuous, for example.

The insulator 28b includes or is substantially made of one or more of Co, Fe, bismuth (Bi), barium (Ba), titanium (Ti), lanthanum (La), strontium (Sr) and ruthenium (Ru). The insulator 28b includes one or more conductors 45 inside.

Each conductor 45 extends along the z-axis from the bottom surface of the insulator 28b to the top surface thereof. The conductor 45 is in contact with the top surface of the upper electrode 26b and the bottom surface of the ferromagnetic layer 31 in the memory cell MCD including the conductor 45. The conductor 45 can function as a current path between a single upper electrode 26b and a single ferromagnetic layer 31. The conductor 45 includes or is substantially made of the same material as one or more of the materials that can be included in the insulator 28b. Specifically, the conductor 45 includes or is substantially made of one or more of Co, Fe, Bi, Ba, Ti, La, Sr, and Ru.

The conductor 45 has a crystal structure other than that of the insulator 28b. For example, the conductor 45 has a perovskite structure or a spinel structure.

2.2. Manufacturing Method

Figure 10:
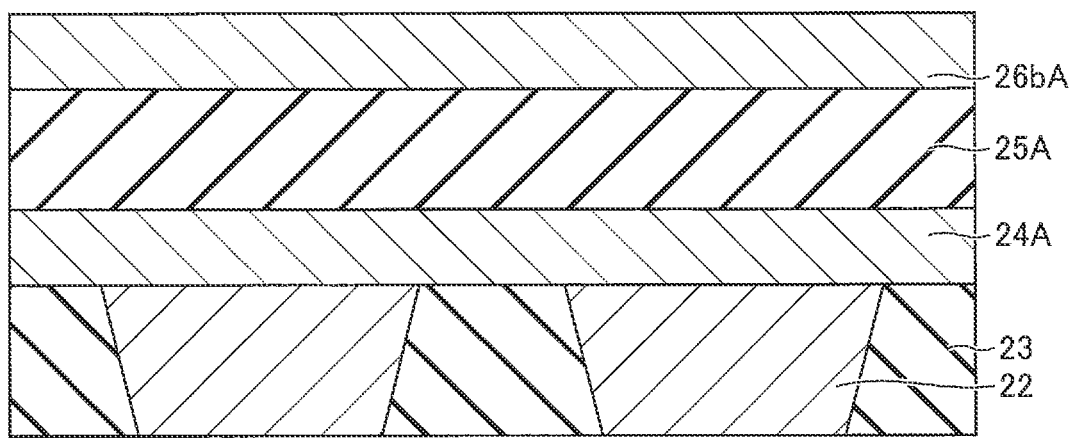
FIG. 10 shows a state in the manufacturing process of the structure of the memory cell according to the second embodiment.
Figure 11:
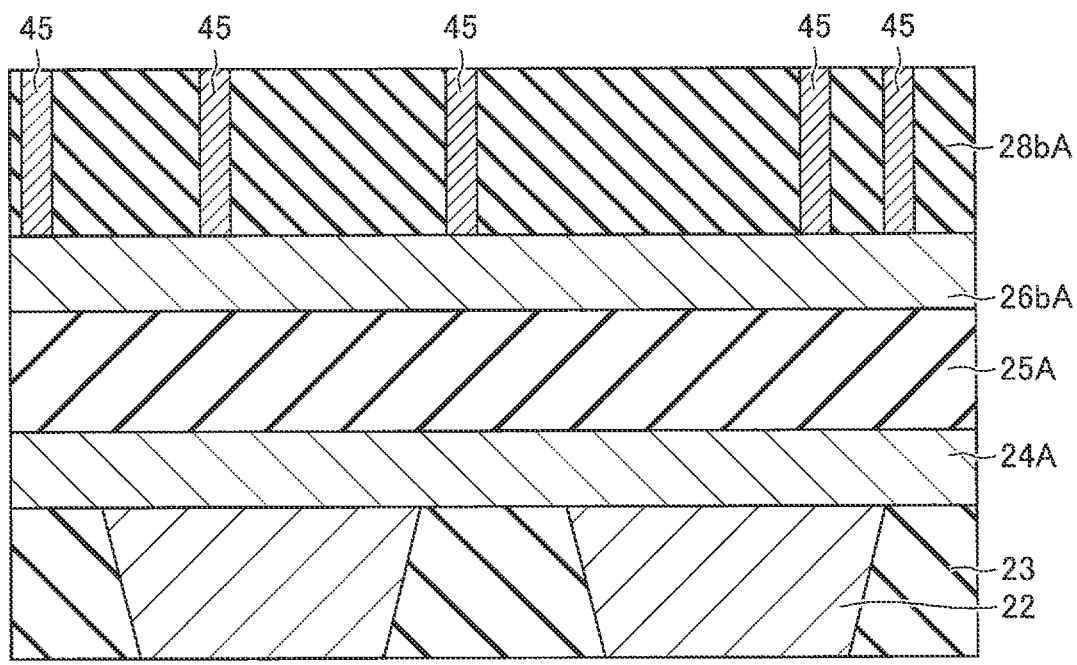
FIG. 11 shows a state subsequent to that shown in FIG. 10.
Figure 12:
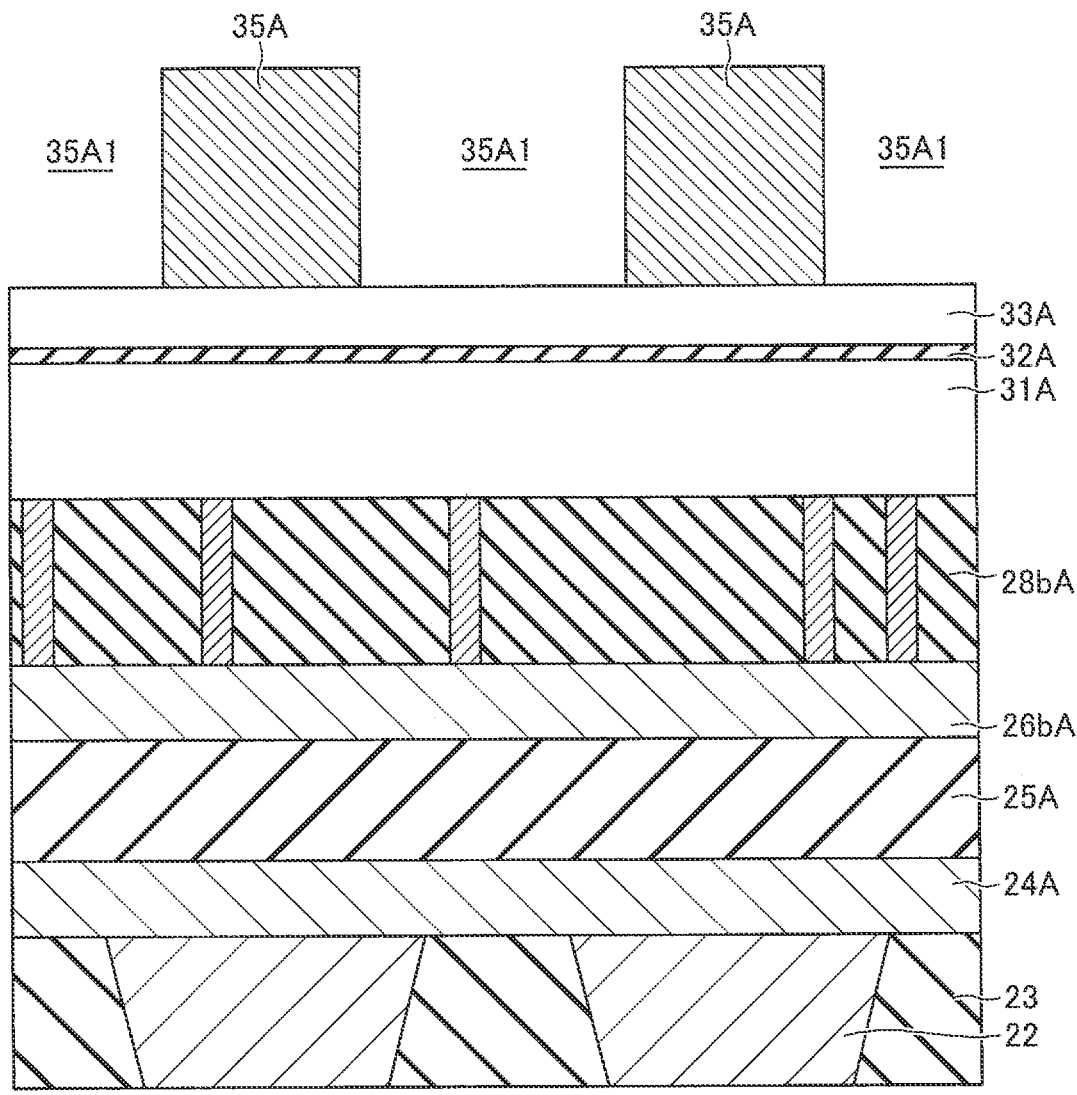
FIG. 12 shows a state subsequent to that shown in FIG. 11.

FIGS. 10 to 12 sequentially show states in a manufacturing process of part of the magnetoresistance memory device according to the second embodiment. FIGS. 10 to 12 show cross sections of the same area as that shown in FIG. 9.

Like in the step described with reference to FIG. 6 of the first embodiment, a conductor 22, an interlayer insulator 23, a lower electrode 24A and a variable resistance material 25A are formed as shown in FIG. 10. An upper electrode 26bA is formed on the top surface of the variable resistance material 25A. The upper electrode 26bA is a component that is formed into an upper electrode 26h by a later step.

As shown in FIG. 11, an insulator 28hA and conductors 45 are formed. The insulator 28hA is a component that is formed into an insulator 28h by a later step. The insulator 28bA and conductors 45 can be formed by any method. As an example, both the source gases of the insulator 28bA and conductors 45 can be used to form the insulator 28bA and the conductor 45 in parallel. For example, the conditions for forming the insulator 22bA and conductors 45 are adjusted, and thereby the conductors 45 are formed by deposition while the insulator 28b is deposited by CVD. According to this method, the locations where the conductors 45 are formed are random and may not always be intended ones. However, the diameter of each of the conductors 45 (the length of a line passing a position on the xy plane, e.g., the length of a line passing the center on the xy plane) is very small and is smaller than that of the insulator 28b. Thus, at least one conductor 45 can be included in all or almost all of the regions of the insulator 28*bA* which are formed into the insulators 28*h* by a later step.

Like in the step described with reference to FIG. 6 of the first embodiment, a ferromagnetic layer 31A, an insulating layer 32A, a ferromagnetic layer 33A and a hardmask 35A are deposited on the top surface of the insulator 28*bA* in that order presented, as shown in FIG. 12.

As shown in FIG. 9, the structure resulting through the foregoing steps is partly removed by IBE. Accordingly, the lower electrode 24A, variable resistance material 25A, upper electrode 26*bA*, insulator 28*bA*, ferromagnetic layer 31A, insulating layer 32A and ferromagnetic layer 33A are formed into the lower electrode 24, variable resistance material 25, upper electrode 26*b*, insulator 28*b*, ferromagnetic layer 31, insulating layer 32 and ferromagnetic layer 33, respectively. One or more of the lower electrode 24A, variable resistance material 25A, upper electrode 26*bA*, insulator 28*hA*, ferromagnetic layer 31A, insulating layer 32A and a ferromagnetic layer 33A may be partly removed by RIE.

2.3. Advantages

According to the second embodiment, an insulator 28 is provided between the upper electrode 26 and the ferromagnetic layer 31, as in the first embodiment. Therefore, the same advantages as those obtained by providing the insulator 28 of the first embodiment can be obtained.

3. Modification

The foregoing descriptions are directed to an example of the magnetoresistance effect element VR in which the ferromagnetic layer 31, insulating layer 32 and ferromagnetic layer 33 are stacked in that order presented. The structure of the magnetoresistance effect element VR is not limited to the example. The ferromagnetic layer 33, insulating layer 32 and ferromagnetic layer 31 may be stacked in that order presented in a direction away from the selector SE. However, the ferromagnetic layer 33 functions as what is called a storage layer and is thinner than the ferromagnetic layer 31. Thus, in the case where the ferromagnetic layer 33 is located at the lowermost position in the magnetoresistance effect element VR, the distance between the upper electrode 26 and the insulating layer 32 is shorter than the case where the ferromagnetic layer 31 is located at the lowermost position in the magnetoresistance effect element VR. Therefore, the structure in which the ferromagnetic layer 31 is located at the lowermost position in the magnetoresistive element VR can more inhibit materials, which are scattered from the upper electrode 26A by IBE to the upper electrode 26A, from being deposited on the side surface of the insulating layer 32.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistance memory device comprising:
a first conductor;
a variable resistance material on a top surface of the first conductor;
a second conductor on a top surface of the variable resistance material;
a first insulator other than nitride on a top surface of the second conductor;
a magnetoresistance effect element on a top surface of the first insulator; and
a third conductor located on a side surface of the first insulator and extending on a side surface of the second conductor and a side surface of the magnetoresistance effect element.

2. The device of claim 1, wherein the second conductor is not in contact with the magnetoresistance effect element.

3. The device of claim 1, wherein:
the magnetoresistance effect element includes:
a first ferromagnetic layer;
a first insulating layer on a top surface of the first ferromagnetic layer; and
a second ferromagnetic layer on a top surface of the first insulating layer; and
the third conductor extends on the side surface of the second conductor and a side surface of the first ferromagnetic layer.

4. The device of claim 1, wherein the third conductor contains a same material as a material contained in the second conductor.

5. The device of claim 1, wherein:
the second conductor contains one or more of titanium nitride, aluminum, tantalum, tungsten, Copper and carbon; and
the third conductor contains the one or more of titanium nitride, aluminum, tantalum, tungsten, copper, and carbon contained in the second conductor.

6. The device of claim 1, wherein:
the second conductor has a second side surface;
the side surface of the second conductor is located above the second side surface of the second conductor; and
the side surface of the first insulator deviates from an extension line of the second side surface of the second conductor.

7. A method of manufacturing a magnetoresistance memory device, comprising:
forming a first conductor;
forming a variable resistance material on a top surface of the first conductor;
forming a second conductor on a top surface of the variable resistance material;
forming a first insulator other than nitride on a first portion of a top surface of the second conductor;
forming a magnetoresistance effect element on a top surface of the first insulator; and
forming a third conductor to extend on a side surface of the second conductor, a side surface of the first insulator, and a side surface of the magnetoresistance effect element.

8. The method of claim 7, wherein the forming of the third conductor includes forming a material removed from the first portion of the top surface of the second conductor on the side surface of the second conductor, the side surface of the first insulator, and the side surface of the magnetoresistance effect element.

9. The method of claim 7, wherein the forming of the third conductor includes irradiating the first portion of the top surface of the second conductor with ion beams.

10. The method of claim 7, wherein the forming of the magnetoresistance effect element includes the magnetoresistance effect element away from the second conductor.

11. The method of claim 7, further comprising partly removing the first conductor, the variable resistance material, and the second conductor.

12. The method of claim 7, wherein the forming of the magnetoresistance effect element includes:
- forming a first ferromagnetic layer on the top surface of the first insulator;
- forming a first insulating layer on a top surface of the first ferromagnetic layer; and
- forming a second ferromagnetic layer on a top surface of the first insulating layer.

13. The method of claim 7, wherein:
- the second conductor contains one or more of titanium nitride, aluminum, tantalum, tungsten, copper and carbon; and
- the third conductor contains the one or more of titanium nitride, aluminum, tantalum, tungsten, copper, and carbon contained in the second conductor.

* * * * *